United States Patent [19]

Umeyama et al.

[11] Patent Number: 5,134,313
[45] Date of Patent: Jul. 28, 1992

[54] PEAK HOLD CIRCUIT

[75] Inventors: Takehiko Umeyama; Hideki Miyake; Yukio Kodama, all of Itami, Japan

[73] Assignee: Mitsubishi Denki Kabushiki Kaisha, Tokyo, Japan

[21] Appl. No.: 536,472

[22] Filed: Jun. 12, 1990

[30] Foreign Application Priority Data

Jul. 14, 1989 [JP] Japan ................... 1-183213

[51] Int. Cl.⁵ ................. H03K 5/159; H03K 5/153; H03K 5/00
[52] U.S. Cl. ................... 307/351; 307/353; 307/362; 328/151
[58] Field of Search ............. 307/352, 351, 353, 355, 307/358, 362, 491; 328/151

[56] References Cited

U.S. PATENT DOCUMENTS

| | | | |
|---|---|---|---|
| 3,820,033 | 6/1974 | Iwata | 307/353 |
| 3,851,260 | 11/1974 | Collin | 307/353 |
| 4,295,099 | 10/1981 | Evans | 307/351 |
| 4,845,382 | 7/1989 | Eouzan et al. | 307/353 |

FOREIGN PATENT DOCUMENTS

| | | | |
|---|---|---|---|
| 0186186 | 9/1985 | Japan | 307/353 |
| 1533468 | 11/1978 | United Kingdom | 307/353 |

Primary Examiner—Stanley D. Miller
Assistant Examiner—Sinh Tran
Attorney, Agent, or Firm—Oblon, Spivak, McClelland, Maier & Neustadt

[57] ABSTRACT

In a sampling mode, a servo signal sampling and holding switch ($4_a$) and a reference voltage sampling and holding switch ($30_a$) are turned off, so that transistors ($Q_{7a}$, $Q_{5a}$) are turned on. In response to on states of the transistors ($Q_{7a}$, $Q_{5a}$), capacities ($C_{3a}$, $C_{30a}$) are charged with the peak voltage ($V_{ref}+(\frac{1}{2})V_s$) of a servo signal and a reference voltage ($V_{ref}$), respectively. In a holding mode, the sampling and holding switches ($4_a$, $30_a$) are turned on, so that the transistors ($Q_{7a}$, $Q_{5a}$) are turned off. the charging voltages (D, E) of the capacitors ($C_{3a}$, $C_{30a}$) are discharged through post-stage buffers ($5_a$, $3_a$), so that they include offsets which are canceled through a subtractor ($6_a$).

4 Claims, 12 Drawing Sheets

PEAK HOLD CIRCUIT

BACKGROUND OF THE INVENTION

1. Field of the Invention

The present invention relates to a peak hold circuit and, more particularly, it relates to a peak hold circuit for sampling and holding the peak of a servo signal which is recorded on a hard disc or the like and used for tracking control, in driving the disc.

FIG. 1 is a circuit diagram showing this type of conventional peak hold circuit. Signals from servo signal input terminals 1a, 1b are applied to a full wave rectifier 2. Differential pair PNP transistors $Q_1$ and $Q_2$ are main elements of the full wave rectifier 2. The transistor $Q_1$ has a base connected to the servo signal input terminal 1a through a capacitor $C_1$ and also connected to a reference voltage source $E_1$ through a resistor $R_1$. The transistor $Q_1$ has a collector connected to a power source $V_{CC}$ and an emitter connected to the emitter of the transistor $Q_2$. A common junction of both of the emitters is connected to a constant current source $I_1$. The transistor $Q_2$ has a base connected to the servo signal input terminal 1b through a capacitor $C_2$ and also connected to the reference voltage source $E_1$ through a resistor $R_2$. The transistor $Q_2$ has a collector connected to the power source $V_{CC}$.

NPN transistors $Q_3$ and $Q_5$ and a PNP transistor $Q_4$ serve as an anti-stage buffer for a reference voltage. The transistor $Q_3$ has a base connected to the reference voltage source $E_1$ through a resistor $R_3$, a collector connected to the power source $V_{CC}$ and an emitter connected to a constant current source $I_2$. The transistor $Q_4$ has a base connected to the emitter of the transistor $Q_3$, a collector connected to the ground and an emitter connected to the power source $V_{CC}$ through a constant current source $I_3$. The transistor $Q_5$ has a base connected to the emitter of the transistor $Q_4$, a collector connected to the power source $V_{CC}$ and an emitter connected to a post-stage buffer 3 for a reference voltage.

A PNP transistor $Q_6$ and an NPN transistor $Q_7$ serve as an anti-stage buffer for a servo signal. The transistor $Q_6$ has a base connected to the common junction of the emitters of the transistors $Q_1$ and $Q_2$, an emitter connected to the power source $V_{CC}$ through a constant current source $I_4$ and a collector connected to the ground. The transistor $Q_7$ has a base connected to the emitter of the transistor $Q_6$ and also connected to the ground through the series connection of a resistor $R_4$ and a switch 4 for sampling and holding a servo signal, a collector connected to the power source $V_{CC}$, and an emitter connected to the ground through a capacitor $C_3$ for holding a servo signal and also connected to the input of a post-stage buffer 5 for a servo signal. The servo signal sampling and holding switch 4 turns ON/OFF in response to an input from a sampling pulse input terminal 8, and accordingly switches between the sampling mode and holding mode. Outputs from the post-stage reference voltage buffer 3 and post-stage servo signal buffer 5 are connected to minus and plus inputs of a subtractor 6, respectively. An output from the subtractor 6 is applied to a post-stage circuit 7.

Now, the operation of the conventional peak hold circuit will be described with reference to FIG. 2. Assume that a servo signal A, which is recorded in a servo region in a hard disc and has an amplitude of $V_s$ as shown in FIG. 2, is inputted to the servo signal input terminal 1a. A signal having a phase opposite to that of the servo signal A is inputted to the servo signal input terminal 1b. The full wave rectifier 2 rectifies the servo signal A and outputs a servo signal B having the peak value of $(V_{ref}+(\frac{1}{2})V_s)$ as shown in FIG. 2, where $V_{ref}$ is the reference voltage of the reference voltage source $E_1$. The reference voltage $V_{ref}$ is applied to the minus input of the subtractor 6 through the transistors $Q_3$, $Q_4$ and $Q_5$ and the post-stage reference voltage buffer 3.

In this situation, when a sampling pulse P inputted the sampling pulse input terminal 8 goes low as shown in FIG. 2, the servo signal sampling and holding switch 4 turns off. The transistor $Q_7$ accordingly turns on, so that the mode changes to the sampling mode. The servo signal C is applied to the holding capacitor $C_3$ through the transistors $Q_6$ and $Q_7$. The servo signal holding capacitor $C_3$ is charged to have the peak voltage $(V_{ref}+(\frac{1}{2})V_s)$ of the servo signal C.

Meanwhile, when the sampling pulse P goes high, the servo signal sampling and holding switch 4 turns on. The transistor $Q_7$ accordingly turns off, so that the mode changes to the holding mode. The charging voltage D of the holding capacitor $C_3$ is applied to the plus input of the subtractor 6 through the post-stage servo signal buffer 5. The subtractor 6 subtracts an output voltage of the post-stage reference voltage buffer 3 from a output voltage of the post-stage servo signal buffer 5 and applies the difference between them to the post-stage circuit 7 which is a tracking control system. The post-stage circuit 7 conducts tracking control using the output voltage from the subtractor 6.

The conventional peak hold circuit structured as hereinbefore described has the following disadvantages.

A transistor $Q_{10}$ is a main element of the post-stage servo signal buffer 5 as shown in FIG. 3. The transistor $Q_{10}$ has a base connected to a common junction of the transistor $Q_7$ and the servo signal holding capacitor $C_3$, a collector connected to the power source $V_{CC}$ and an emitter connected to a constant current source $I_{10}$ and also connected to the plus input of the subtractor 6. In the holding mode, the charging voltage of the servo signal holding capacitor $C_3$ is discharged through the base of the transistor $Q_{10}$, the emitter of the transistor $Q_{10}$ and the constant current source $I_{10}$ the ground, so that the charging voltage D of the holding capacitor $C_3$ is reduced as time passes, as shown in FIG. 2. Consequently, the charging voltage D has a servo signal offset corresponding to an oblique line portion of FIG. 2.

Meanwhile, the reference voltage $V_{ref}$ is constant in any mode of the sampling mode and the holding mode as shown in FIG. 2. Accordingly, the output voltage I of the subtractor 6 includes an offset corresponding to the servo signal offset as shown with oblique lines in FIG. 2. As a result, with the output voltage I of the subtractor 6, tracking control can not be effected accurately.

Further, the servo region must be narrowed to increase information recorded in the hard disc. However, when the servo region is narrowed, a occurrence period of the servo signals A and C are shortened as shown in FIG. 4. This may cause a case in which the charging voltage D of the holding capacitor $C_3$ does not reach the peak value $(V_{ref}+(\frac{1}{2})V_s)$ of the servo signal C as shown in FIG. 4. This, together with the above mentioned servo signal offset, results in that the output voltage I of the subtractor 6 has a large offset corresponding to an oblique line portion of in FIG. 4. As a result, tracking control can not be effected accurately. Moreover, in the case that the sampling period is short (i.e., the period for which the sampling pulse is low is short), also, disadvantages similar to the case in which the servo region is narrowed as previously mentioned are caused.

SUMMARY OF THE INVENTION

A peak hold circuit according to the present invention comprises servo signal input means for inputting a servo signal for tracking control, reference voltage input means for inputting a reference voltage, mode switching means for switching between a sampling mode and a holding mode, first sample and hold means connected to the servo signal input means and the mode switching means for being charged with a first voltage corresponding to a peak value of the servo signal in the sampling mode to hold the first voltage in the holding mode, and second sample and hold means connected to the reference voltage input means and &he mode switching means for being charged with a second voltage corresponding to the reference voltage in the sampling mode to hold the second voltage in the holding mode.

According to the present invention, by setting characteristics of the first and second sampling and holding means in sampling and holding to be the same, offsets included in outputs of the first and second holding means become equal, and thus an output without an offset can be obtained by making subtraction between them to cancel the offsets.

Accordingly, it is an object of the present invention to provide a peak hold circuit capable of outputting a signal with no offset.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 5:
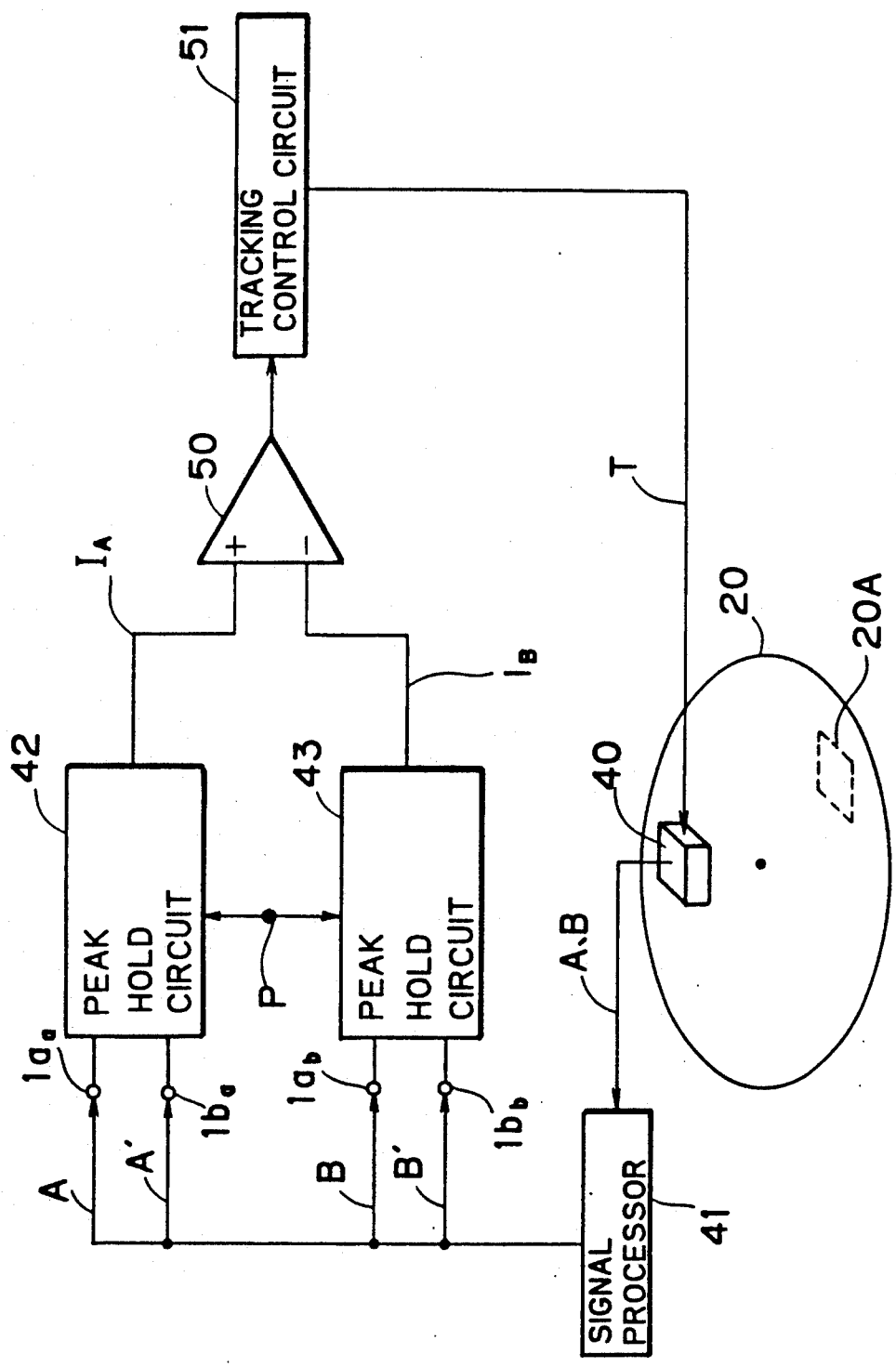
FIG. 5 is a block diagram showing the structure of a tracking control unit of a hard disc driver.

FIG. 5 is a block diagram showing the structure of a tracking control unit in a hard disc driver. A head 40 reads servo signals A and B recorded in a servo region in a hard disc 20 and applies them to a signal processor 41. The signal processor 41 separates the servo signals A and B while it produces signals A' and B' which have opposite phases to the signals A and B. The signal processor 41 applies the servo signal A and the signal A' to servo signal input terminals $1a_a$ and $1b_a$ of a peak hold circuit 42, respectively, and applies the servo signal B and the signal B' to servo signal input terminals $1a_b$ and $1b_b$ of a peak hold circuit 43, respectively. The peak hold circuit 42 samples and holds the peak value of the servo signal A in response to a sampling pulse P to apply a signal $I_A$ indicating the peak value to the plus input of a subtractor 50. The peak hold circuit 43 samples and holds the peak value of the servo signal B in response to the sampling pulse P to apply a signal $I_B$ indicating the peak value to the minus input of the subtractor 50. The subtractor 50 forms the difference of the signals $I_A$ and $I_B$ to apply it to a tracking control circuit 51. The tracking control circuit 51 produces a tracking control signal T in accordance with an output from the subtractor 50. The head 40 is moves in accordance with the tracking control signal T.

Figure 6:
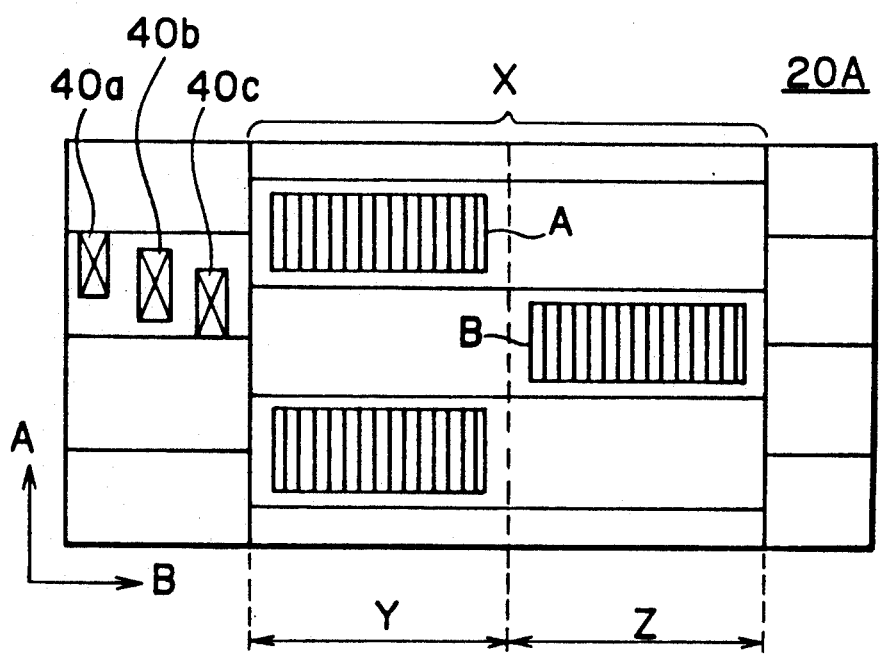
FIG. 6 is an enlarged view showing a part of a hard disc.
Figure 7:
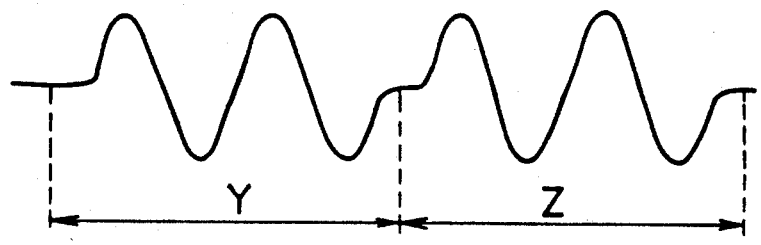
FIG. 7 and FIG. 8 and FIG. 9 are diagrams explaining the operation of the control unit shown in FIG. 5.

FIG. 6 is an enlarged view illustrating a portion 20A of the hard disc 20. An arrow A indicates a radiuswise direction and an arrow B indicates a circumferential direction. In a servo region X, the servo signals A and B are recorded to perform tracking control of the head 40. When the normal tracking is carried out, the head 40 is in a normal position 40b. At this time, the head 40 reads both the servo signals A and B to the same extent, and therefore both of Y and z regions have the same peak value in signals. A signal of the Y region shown in FIG. 7 is inputted to the servo signal input terminal $1a_a$ while a signal of the z region shown in FIG. 7 is inputted to the servo signal input terminal $1b_a$. On the other hand, signals in an opposite phase to those of the signals of the Y and Z regions are inputted to the servo signal input terminals $1a_b$ and $1b_b$, respectively. In this case, the potential at the plus input of the subtractor 50 is equal to the potential of the minus input so that the output of the subtractor 50 becomes 0. The tracking control circuit 51 produces the tracking control signal T for maintaining the head 40 at the current position.

Figure 8:
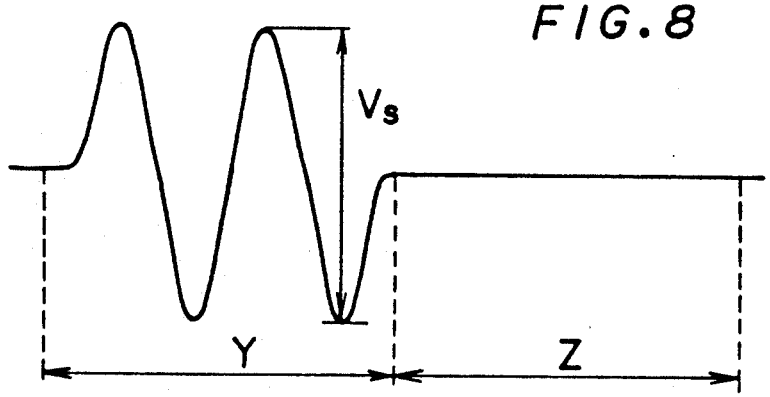

A case in which the head 40 is deviated to the radius-wise direction (direction A) in the disc 20 will now be explained. When the head 40 moves to a deviant position 40a, the head 40 reads only the servo signal A but not the servo signal B. Consequently, a signal (with a large amplitude) in the Y region shown in FIG. 8 is inputted to the servo signal input terminal $1a_a$ while a signal (with zero amplitude) in the Z region shown in FIG. 8 is inputted to the servo signal input terminal $1b_a$.

In this case, since the voltage applied to the plus input of the subtractor 50 is larger than the voltage applied to the minus input, the subtractor 50 applies a positive voltage to the tracking control circuit 51. In response to the positive voltage, the tracking control circuit 51 applies the tracking control signal T to the head 40 to move the head 40 to the centerwise direction (direction opposite to the direction A) in the disc 20. In response to this tracking control signal T, the head 40 moves to the centerwise direction in the disc 20 to compensate the deviation.

Figure 9:
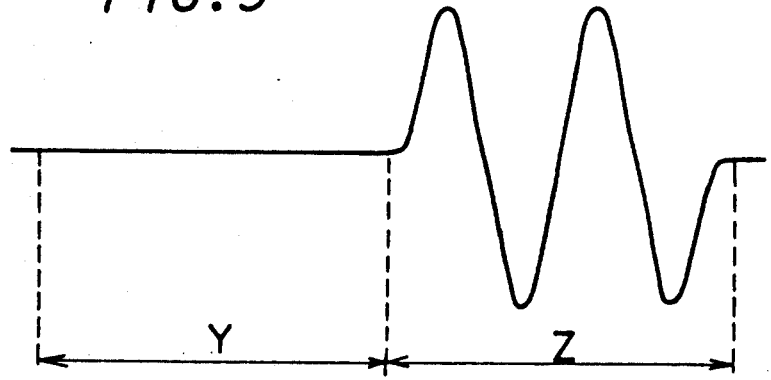

A case in which the head 40 is deviated in the centerwise direction in the hard disc 20 will now be explained. When the head 40 moves to a deviant position 40c, the head 40 deeply reads only the servo signal B but not the servo signal A. Consequently, a signal (with zero amplitude) of the Y region shown in FIG. 9 is inputted to the servo signal input terminal $1a_a$ while a signal (with a large amplitude) of the Z region shown in FIG. 9 is inputted to the servo signal input terminal $1b_a$.

In this case, since the voltage applied to the minus input of the subtractor 50 is larger than the voltage applied to the plus input, the subtractor 50 applies a negative voltage to the tracking control circuit 51. In response to the negative voltage, the tracking control circuit 51 applies the tracking control signal T for moving the head 40 to the radiuswise direction A in the disc 20. In response to this tracking signal T, the head 40 moves to the radiuswise direction A in the disc 20 to compensate the deviation.

Figure 10:
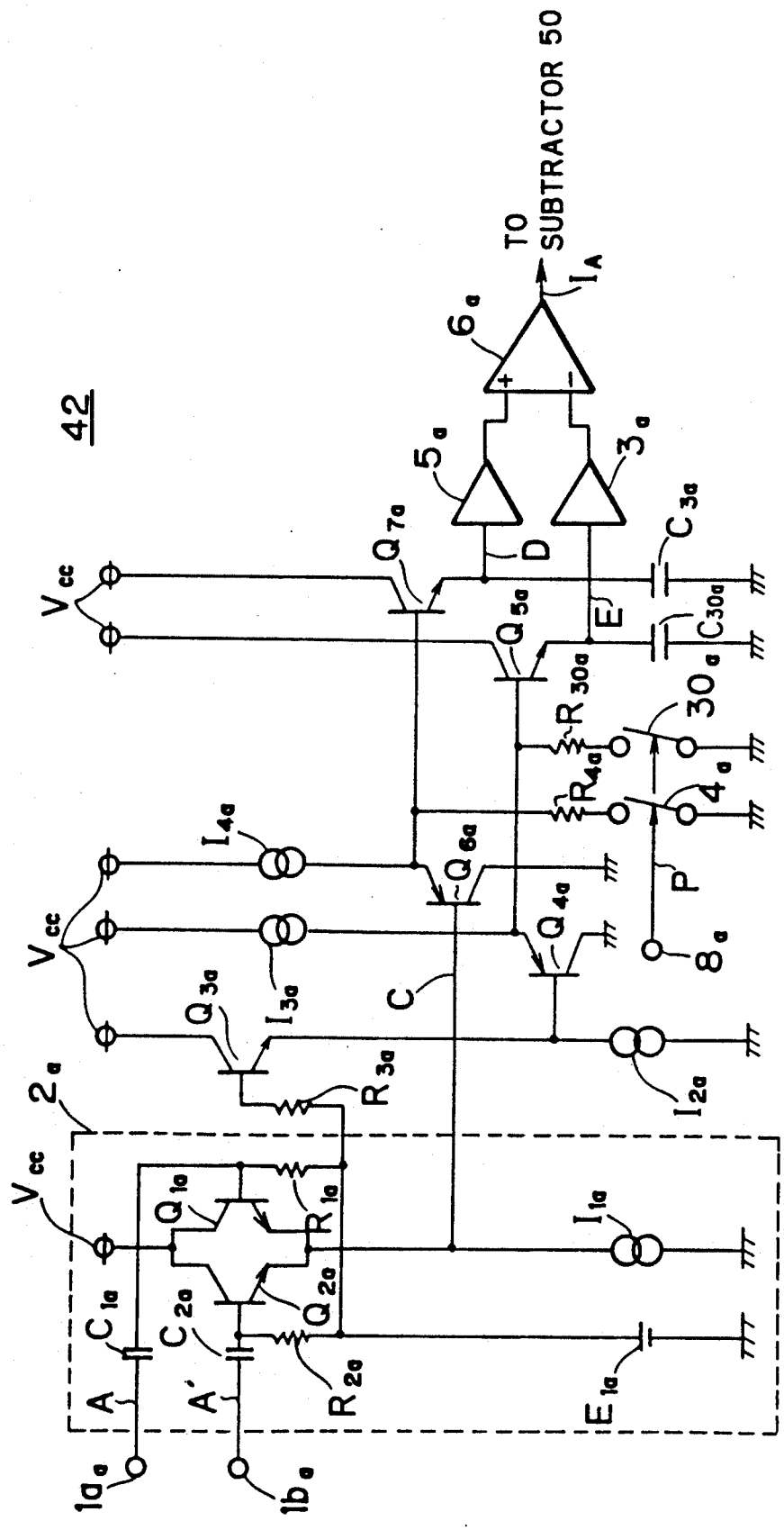
FIG. 10 and FIG. 11 are circuit diagrams showing embodiments of a peak hold circuit according to the invention.
Figure 11:
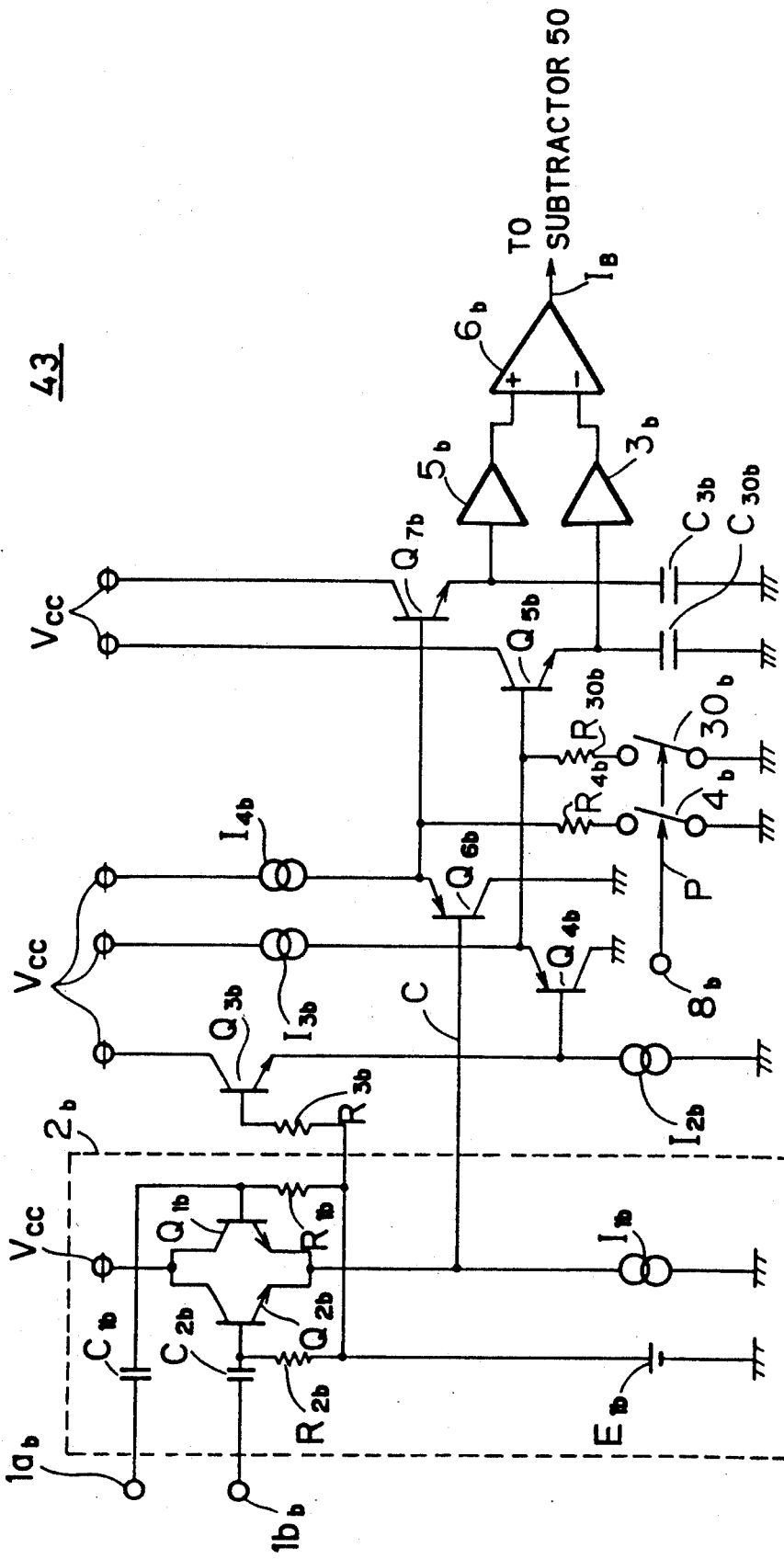

FIG. 10 and FIG. 11 are circuit diagrams showing embodiments of the peak hold circuit according to the present invention. The circuit shown in FIG. 10 corresponds to the peak hold circuit 42 shown in FIG. 5 while the circuit shown in FIG. 11 corresponds to the peak hold circuit 43 shown in FIG. 5. The circuits shown in FIG. 10 and FIG. have the same structure, and therefore the circuit shown in FIG. 10 only will be described.

Figure 1:
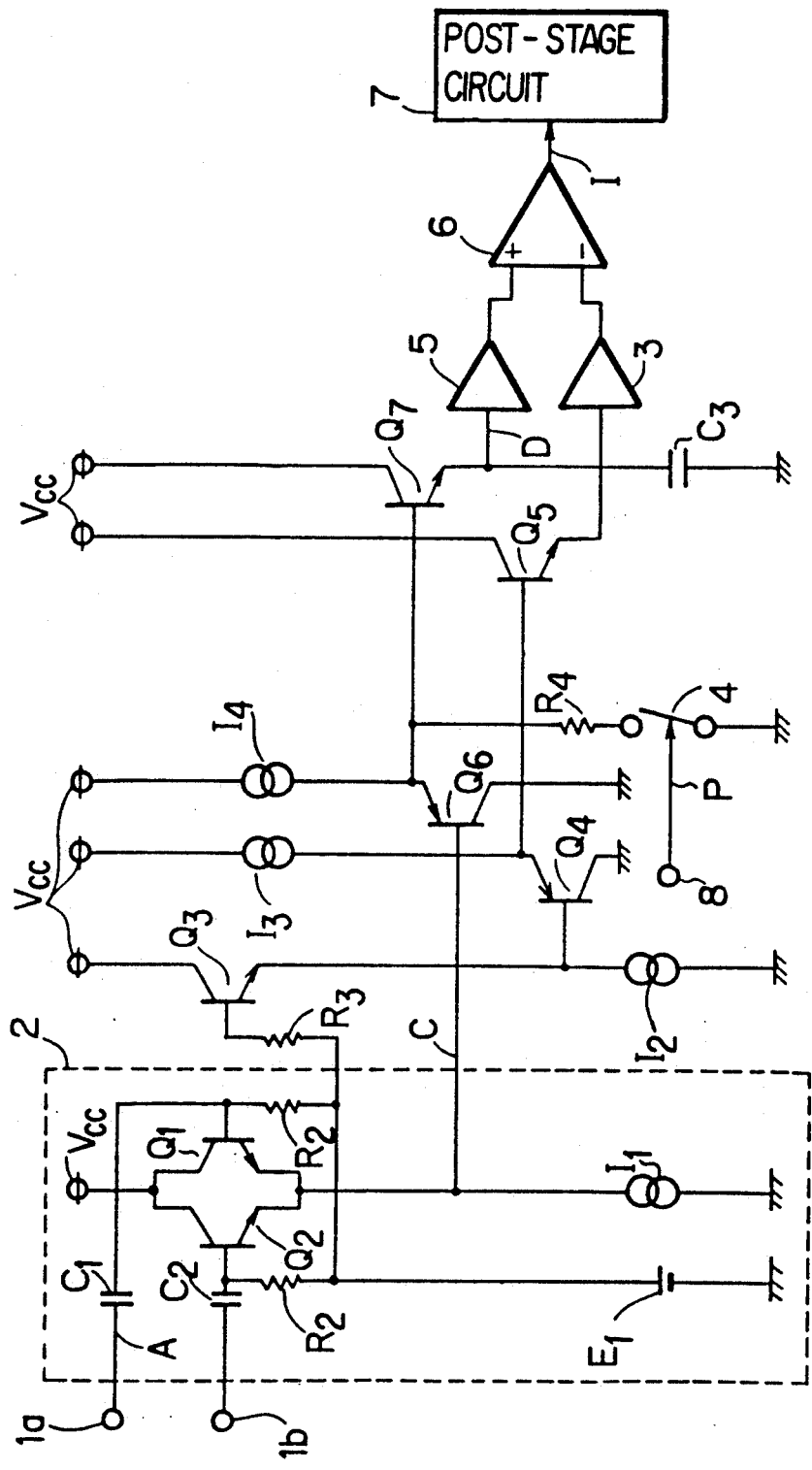
FIG. 1 is a circuit diagram showing a conventional peak hold circuit.

The circuit shown in FIG. 10 is different from the conventional circuit shown in FIG. 1 in that the former circuit samples and holds not only a servo signal C but also a reference voltage $V_{ref}$ on the same condition for the servo signal C. Accordingly, the circuit is additionally provided with a switch $C_{30a}$ for sampling and holding a reference voltage and a capacitor $C_{30a}$ for holding a reference voltage. The reference voltage sampling and holding switch $30a$ has one end connected to the ground and the other end connected to the base of a transistor $Q_{5a}$ through a resistor $R_{30a}$. The reference voltage sampling and holding switch $30_a$ turns ON/OFF depending on the level of a sampling pulse P applied from a sampling pulse input terminal $8_a$. The reference voltage holding capacitor $C_{30a}$ is connected between the ground and a common junction of the emitter of the transistor $Q_{5a}$ and the input of a post-stage buffer $3_a$ for a reference voltage. The reference voltage holding capacitor $C_{30a}$ switches between a holding mode and a sampling mode depending on the ON/OFF of the reference voltage sampling and holding switch $30_a$.

Figure 12A:
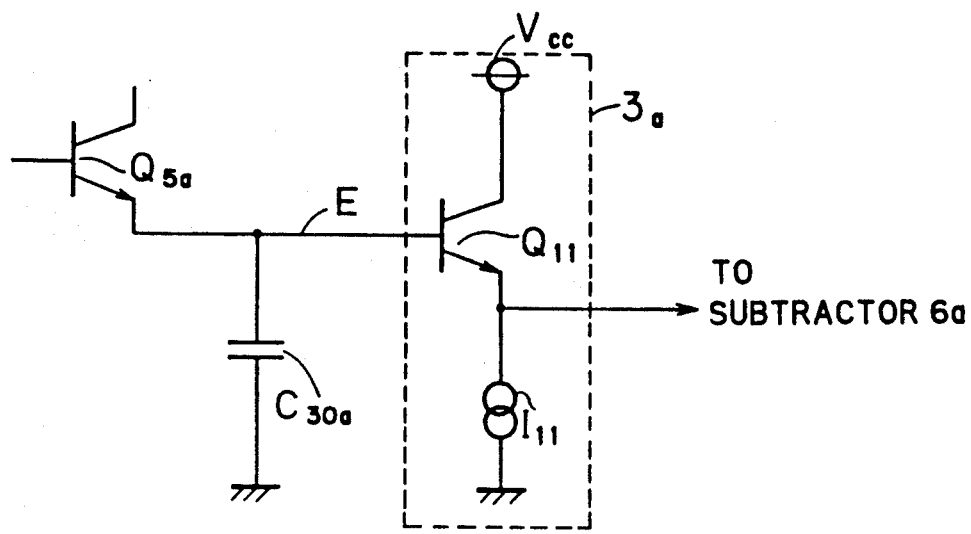
FIG. 12A is a circuit diagram showing the structure of a post-stage reference voltage buffer.
Figure 12B:
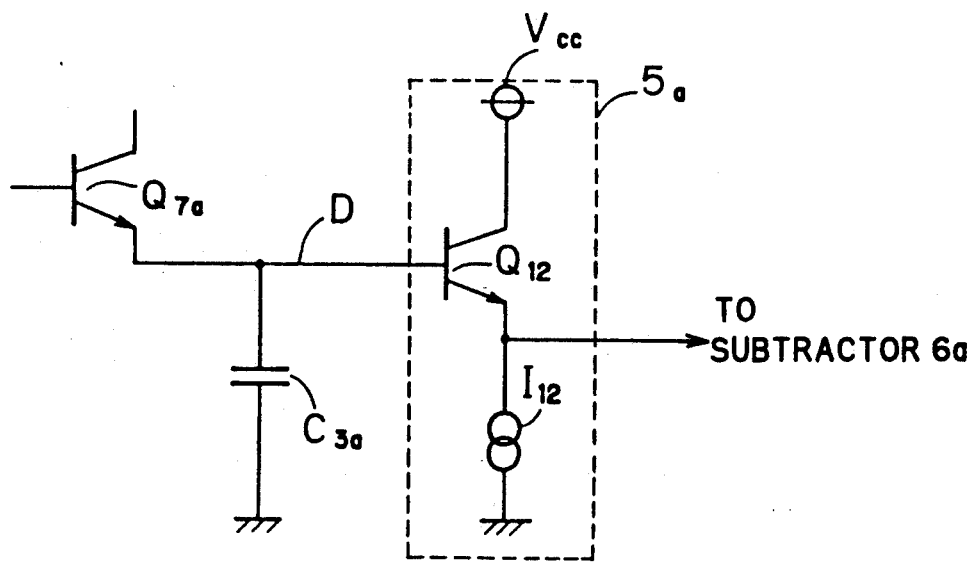
FIG. 12B is a circuit diagram showing the structure of a post-stage servo signal buffer.

The structure of the post-stage reference voltage buffer $3_a$ is shown in FIG. 12A. An NPN transistor $Q_{11}$ has a base connected to a common junction of the emitter of the transistor $Q_{5a}$ and the capacitor $C_{30a}$, a collector connected to a power source $V_{CC}$ and an emitter connected to the ground through a constant current source $I_{11}$. A post-stage buffer $5_a$ for a servo signal has the same structure, as shown in FIG. 12B.

In the circuit shown in FIG. 10, elements corresponding to those of the conventional circuit shown in FIG. 1 are represented with like reference numerals with a small letter "a". Also, in the circuit shown in FIG. 11, a small letter "b" takes the place of the small letter "a".

The operation of the peak hold circuit 42 will now be described. The signals A and A', which are inputted to the servo signal input terminals $1a_a$ and $1b_a$ and have phases opposite to each other, are applied to a full wave rectifier $2_a$. The servo signal A inputted to the servo signal input terminal $1a_1$ is applied to the base of a transistor $Q_{1a}$ through a coupling capacitor $C_{1a}$. The signal A' inputted to the servo signal input terminal $1b_a$ is applied to the base of a transistor $Q_{2a}$ through a coupling capacitor $C_{2a}$. The conductivities of the transistors $Q_{1a}$ and $Q_{2a}$ vary in accordance with the level of the signals A and A' applied to the respective bases. The full-wave-rectified servo signal C is applied to the base of a transistor $Q_{6a}$.

Figure 2:
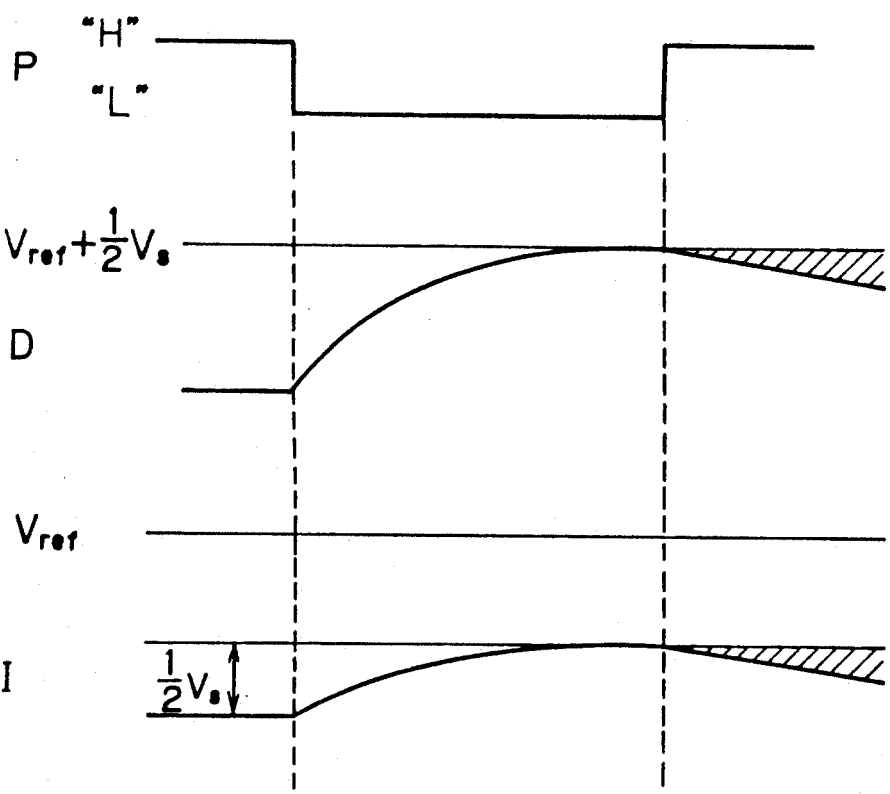
FIG. 2 and FIG. 4 are diagrams explaining the operation of the circuit shown in FIG. 1.
Figure 3:
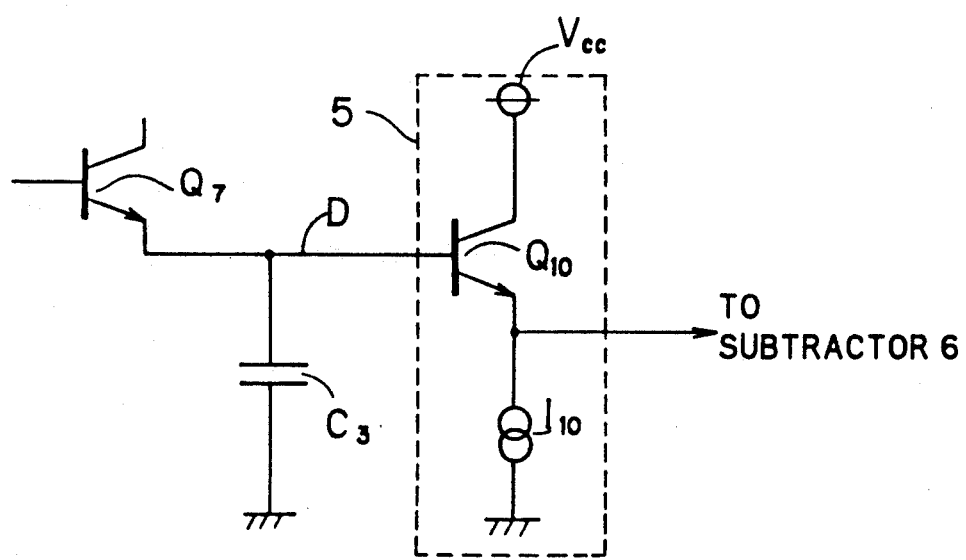
FIG. 3 is a circuit diagram showing a structure of a post-stage servo signal buffer.
Figure 4:
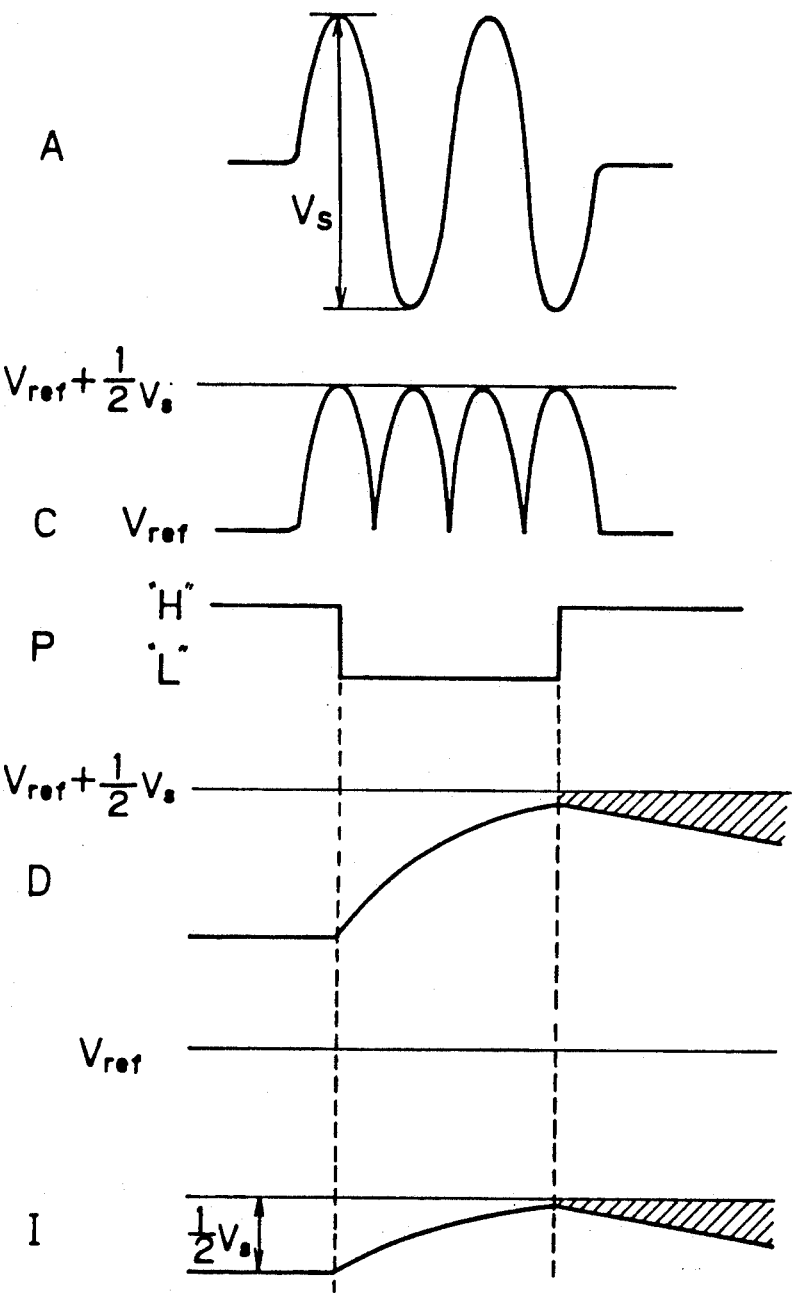
Figure 13:
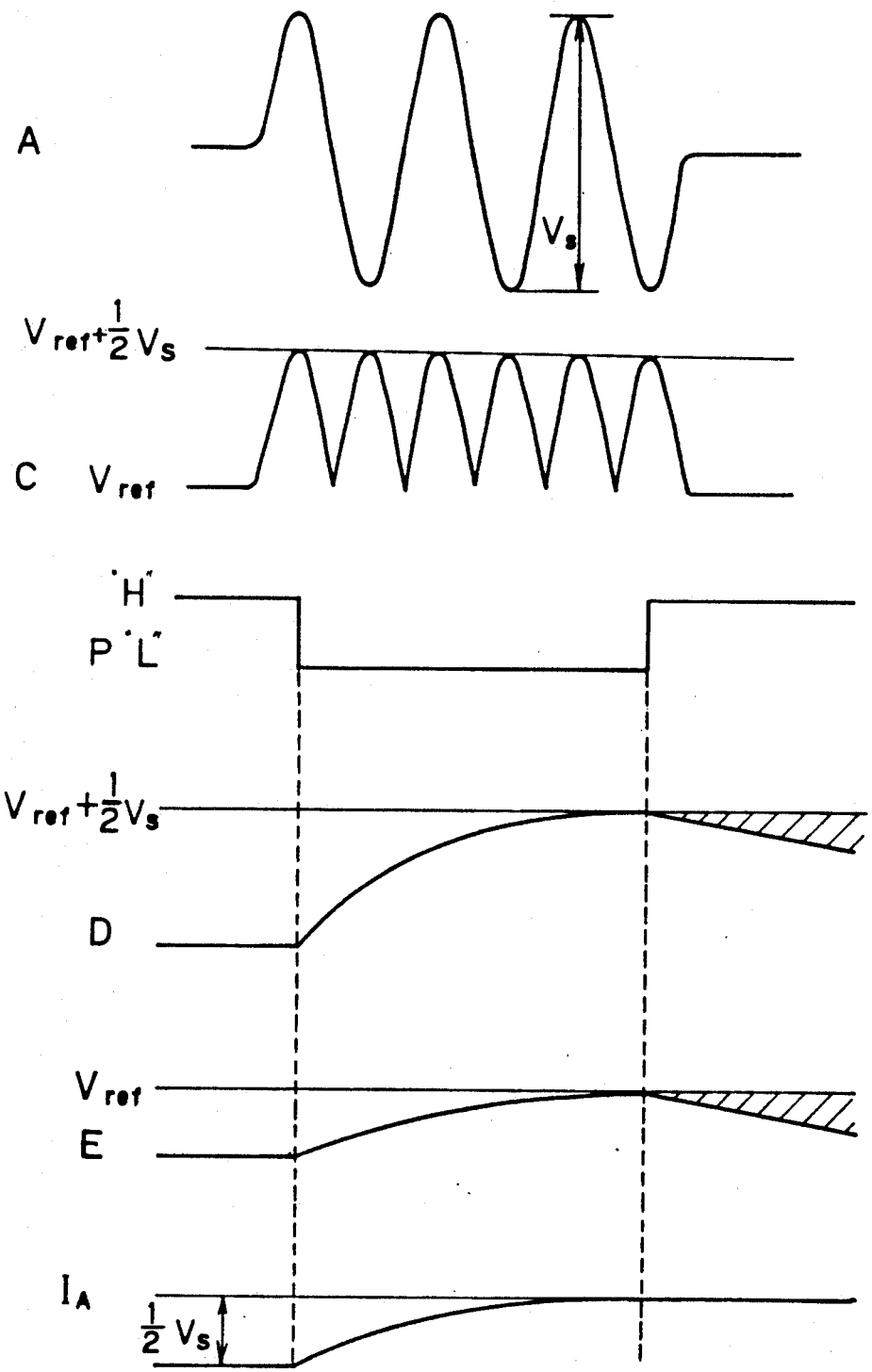
FIG. 13 and FIG. 14 are diagrams explaining the operation of the circuit shown in FIG. 10 and FIG. 11.

This servo signal C applied to the base of the transistor $Q_{6a}$ is biased by the reference voltage $V_{ref}$ of a reference voltage source $E_{1a}$ and has the same peak value $(V_{ref}+(\frac{1}{2})V_s)$ as the signal shown in FIG. 2. The reference voltage $V_{ref}$ is applied to the base of a transistor $Q_{4a}$ from a reference voltage source $E_{1a}$ through a transistor $Q_{3a}$. In this situation, a servo signal sampling and holding switch $4_a$ and the reference voltage sampling and holding switch $30_a$ turn off when the sampling pulse P inputted to the sampling pulse input terminal $8_a$ goes low as shown in FIG. 13. In response to that, transistors $Q_{7a}$ and $Q_{5a}$ turn on, so that the mode changes to the sampling mode. As the transistor $Q_{7a}$ turns on, the servo signal C is applied to a capacitor $C_{3a}$ for holding a servo signal through the transistors $Q_{6a}$ and $Q_{7a}$. As a result, the servo signal holding capacitor $C_{3a}$ is charged, and the charging voltage D reaches the peak voltage $(V_{ref}+(\frac{1}{2})V_s)$ of the servo signal C as shown in FIG. 13. Further, as the transistor $Q_{5a}$ turns on, the reference voltage $V_{ref}$ is applied to the reference voltage holding capacitor $C_{30a}$ through the transistors $Q_{4a}$ and $Q_{5a}$. As a result, the reference voltage holding capacitor $C_{30a}$ is charged, and the charging voltage E reaches the reference voltage $V_{ref}$.

When the sampling pulse P goes high, both of the sampling and holding switches $4_a$ and $30_a$ turn on. In response to the turning on of the sampling and holding switches $4_a$ and $30_a$, the transistors $Q_{7a}$ and $Q_{5a}$ turn off, so that the mode changes to the holding mode. In the holding mode, the charging voltage D $(V_{ref}+(\frac{1}{2})V_s)$ of the servo signal holding capacitor $C_{3a}$ leaks from the base to the emitter of a transistor $Q_{12}$ shown in FIG. 12B which is an element of a post-stage buffer $5_a$ for a servo signal. As a result, the charging voltage D of the servo signal holding capacitor $C_{3a}$ is gradually reduced from $V_{ref}+(\frac{1}{2})V_s$ as shown in FIG. 13 so that an offset corresponding to an oblique line portion shown in FIG. 13 is caused. Meanwhile, the charging voltage E $(V_{ref})$ of the reference voltage holding capacitor $C_{30a}$ also leaks from the base to the emitter of a transistor $Q_{11}$ shown in FIG. 12A which is an element of the post-stage reference voltage buffer $3_a$. As a result, the charging voltage E of the reference voltage holding capacitor $C_{30a}$ is also gradually reduced from $V_{ref}$ as shown in FIG. 13, so that an offset corresponding to an oblique line portion shown in FIG. 13 is caused. When each element is conditioned to make the offset of the charging voltage D equal to that of the charging voltage E, the offsets are cancelled so that the signal $I_A$ having no offset as shown in FIG. 13 is outputted from the subtractor $6_a$.

Figure 14:
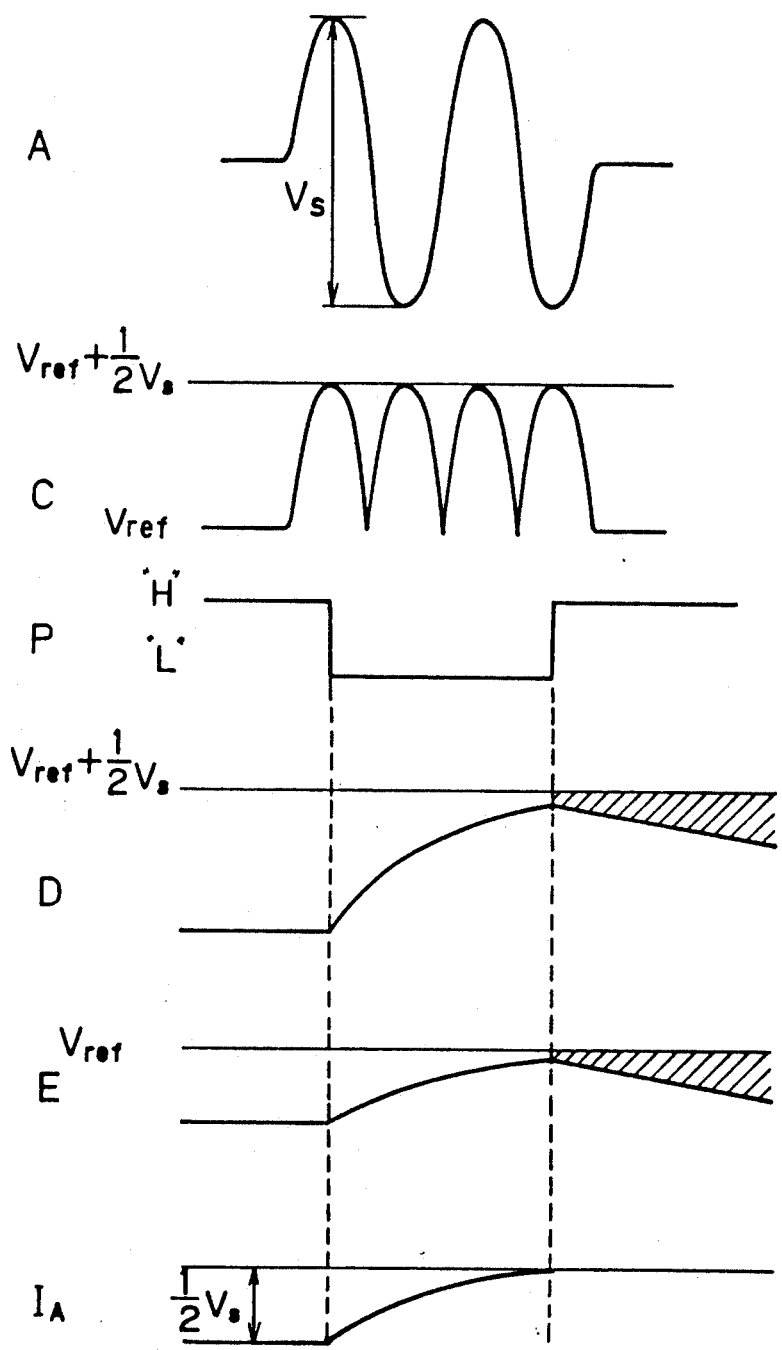

Then, a case will be explained, in which the servo region X is narrowed because of an increase in information recorded in the disc 20 and accordingly an occurrence period of the servo signals A and C is shortened. In this case, in the sampling mode, the charging voltage D of the servo signal holding capacitor $C_{3a}$ does not reach the peak value $(V_{ref}+(\frac{1}{2})V_s)$ of the servo signal C as shown in FIG. 14. Assuming now that the sampling efficiency is $\alpha$ $(\alpha<1)$, the charging voltage D of the capacitor $C_{3a}$ is given by $\alpha \cdot$ transistor $Q_{12}$ shown in FIG. 12B which is an element of the post-stage servo signal buffer $5_a$ as mentioned above. Consequently, the charging voltage D of the capacitor $C_{3a}$ is gradually reduced from $\alpha \cdot (V_{ref}+(\frac{1}{2})V_s)$ as shown in FIG. 14, so that an offset corresponding to an oblique line portion shown in FIG. 14 is caused.

On the other hand, in the sampling mode the reference voltage $V_{ref}$ is also sampled. When each element is conditioned so that the sampling efficiency for the reference voltage $V_{ref}$ is $\alpha$ similar to the sampling efficiency for the servo signal, the charging voltage E of the reference voltage holding capacitor $C_{30a}$ is $\alpha \cdot V_{ref}$. The charging voltage E of the capacitor $C_{30a}$ leaks from the base to emitter of the transistor $Q_{11}$ shown in FIG. 12A which is an element of the post-stage reference voltage buffer $3_a$ as mentioned above. As a result, the charging voltage E is gradually reduced from $\alpha \cdot V_{ref}$ as shown in FIG. 14, so that an offset corresponding to an oblique line portion shown in FIG. 14 is caused. Each element is conditioned so that the degrees of reduction in the hold voltages of the capacitors $C_{3a}$ and $C_{30a}$ are the same. Thus, the signal $I_A$ indicating the true peak value $(\frac{1}{2})V_S$ of the servo signal C, in which the offsets are canceled as shown in FIG. 14, is outputted from the subtractor $6_a$.

Although the operation of the peak hold circuit 42 has been described, the peak hold circuit 43 conducts the operation similar to the foregoing. Accordingly, the signal $I_B$, in which offsets are canceled, can be obtained at the output of a subtractor $6_b$ of the peak hold circuit 43.

Outputs from the subtractors $6_a$ and $6_b$ are applied to the plus and minus inputs of the subtractor 50, respectively. The subtractor 50 subtracts the output of the subtractor $6_b$ from the output of the subtractor $6_a$ and applies the difference between them to the tracking control circuit 51. The tracking control circuit 51 produces the tracking control signal T in accordance with the output from the subtractor 50 to regulate the position of the head 40 as mentioned above. The outputs from the subtractors $6_a$ and $6_b$ include no offset voltage as stated above, so that an accurate tracking control can be attained. Additionally, an output in which offsets are canceled out can be obtained even when a short sampling period, so that a high speed peak hold circuit can be implemented.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A peak hold circuit, comprising:
   servo signal input means for inputting a servo signal for tracking control;
   reference voltage input means for inputting a reference voltage;
   mode switching means for switching between a sampling mode and a holding mode;
   first sample and hold means connected to said servo signal input means and said mode switching means, for being charged with a first voltage corresponding to a peak value of said servo signal in the sampling mode to hold said first voltage in the holding mode wherein said first sample and hold means has a first offset characteristic with respect to said first voltage;
   second sample and hold means connected to said reference voltage input means and said mode switching means, for being charged with a second voltage corresponding to said reference voltage in the sampling mode to hold said second voltage in the holding mode wherein said second sample and hold means has a second offset characteristic with respect to said second voltage;
   a subtractor having first and second inputs connected to said first and second sample and hold means, respectively, for receiving said first and second voltage to output a difference voltage between said first and second voltage and wherein said first and second offset characteristics are equal,
   said first sample and hold means includes first buffer means connected to said servo signal input means for buffering said servo signal and a first capacitor connected to an output of said first buffer means,
   said second sample and hold means includes second buffer means connected to said reference voltage input means for buffering said reference voltage and a second capacitor connected to an output of said second buffer means,
   said mode switching means includes activating means connected to said first and second buffer means for activating said first and second buffer means in said sampling mode and inactivating said first and second buffer means in said holding means,
   said first buffer means includes a first transistor having a first electrode coupled to a first potential, a second electrode coupled to a second potential through said first capacitor and a control electrode coupled to said servo signal input means,
   said second buffer means includes a second transistor having a first electrode coupled to said first potential, a second electrode coupled to said second potential through said second capacitor and a control electrode coupled to said reference voltage input means.

2. A peak hold circuit in accordance with claim 1, wherein
   said activating means includes
   a sampling pulse input means for inputting a sampling pulse,
   a first switch coupled between said control electrode of said first transistor and a third potential, for being switched ON/OFF in response to said sampling pulse, and
   a second switch coupled between said control electrode of said second transistor and said third potential, for being switched ON/OFF in response to said sampling pulse.

3. A peak hold circuit in accordance with claim 1, wherein
   said servo signal includes first and second servo signals having opposite phases,
   said servo signal input means including first and second input terminals for inputting said first and second servo signals, respectively, and a full wave rectifier connected to said first and second input terminals for rectifying said servo signal.

4. A peak hold circuit in accordance with claim 3, wherein
   said full wave rectifier is connected to said reference voltage input means to be biased by said reference voltage.

* * * * *